(12) United States Patent
Koschinsky et al.

(10) Patent No.: US 9,171,754 B2
(45) Date of Patent: Oct. 27, 2015

(54) METHOD INCLUDING AN ETCHING OF A PORTION OF AN INTERLAYER DIELECTRIC IN A SEMICONDUCTOR STRUCTURE, A DEGAS PROCESS AND A PRECLEAN PROCESS

(71) Applicant: GLOBALFOUNDRIES Inc., Grand Cayman (KY)

(72) Inventors: Frank Koschinsky, Radebeul (DE); Bernd Hintze, Langebrueck (DE); Oliver Witnik, Moritzburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 106 days.

(21) Appl. No.: 13/901,739

(22) Filed: May 24, 2013

(65) Prior Publication Data

US 2014/0349478 A1 Nov. 27, 2014

(51) Int. Cl.
*H01L 21/00* (2006.01)
*H01L 21/768* (2006.01)

(52) U.S. Cl.
CPC .... *H01L 21/76814* (2013.01); *H01L 21/76826* (2013.01); *H01L 21/76828* (2013.01)

(58) Field of Classification Search
CPC ............... H01L 21/76814; H01L 21/76826; H01L 21/76828

USPC .................................................. 438/687, 660
See application file for complete search history.

(56) References Cited

U.S. PATENT DOCUMENTS

| | | | |
|---|---|---|---|
| 6,167,891 B1 * | 1/2001 | Kudelka et al. | 134/1.3 |
| 6,263,587 B1 * | 7/2001 | Raaijmakers et al. | 34/404 |
| 7,030,023 B2 * | 4/2006 | Pan et al. | 438/700 |

* cited by examiner

*Primary Examiner* — Richard Booth
(74) *Attorney, Agent, or Firm* — Amerson Law Firm, PLLC

(57) ABSTRACT

A method includes providing a semiconductor structure. The semiconductor structure includes a substrate having a frontside and a backside, an electrically conductive feature including copper provided at the frontside of the substrate and a low-k interlayer dielectric provided over the electrically conductive feature. A portion of the interlayer dielectric is etched. In the etch process, a surface of the electrically conductive feature is exposed. A degas process is performed, wherein the semiconductor structure is exposed to a first gas, and wherein the semiconductor structure is heated from the backside and from the frontside. A preclean process may be performed. The preclean process may include a first phase wherein the semiconductor structure is exposed to a substantially non-ionized second gas and a second phase wherein the semiconductor structure is exposed to a plasma created from the second gas.

28 Claims, 7 Drawing Sheets

METHOD INCLUDING AN ETCHING OF A PORTION OF AN INTERLAYER DIELECTRIC IN A SEMICONDUCTOR STRUCTURE, A DEGAS PROCESS AND A PRECLEAN PROCESS

BACKGROUND OF THE INVENTION

1. Field of the Invention

Generally, the present disclosure relates to the field of integrated circuits, and, in particular, to interconnections in integrated circuits.

2. Description of the Related Art

Integrated circuits typically include a large number of circuit elements, which form an electric circuit. In addition to active devices, such as, for example, field effect transistors and/or bipolar transistors, circuit elements provided in integrated circuits may include passive devices such as capacitors, inductivities and/or resistors. The devices are connected internally by means of electrically conductive lines including an electrically conductive material such as, for example, copper. To accommodate all the electrically conductive lines required to connect the circuit elements in modern integrated circuits, the electrically conductive lines may be arranged in a plurality of levels stacked on top of each other. To connect electrically conductive lines provided in different levels, contact vias may be formed in interlayer dielectrics separating the levels from each other. The vias may be filed with an electrically conductive material, which may include a metal such as, for example, copper.

For forming electrically conductive lines and contact vias including an electrically conductive material including copper in a semiconductor structure, the dual damascene technique may be employed.

In the dual damascene technique, contact vias and trenches are formed in an interlayer dielectric. The trenches correspond to the electrically conductive lines. One or more diffusion barrier layers including a diffusion barrier layer material such as, for example, titanium nitride, tantalum and/or tantalum nitride, as well as a layer of the electrically conductive material, for example a layer of copper and/or a copper alloy, are deposited over the semiconductor structure.

Thereafter, a chemical mechanical polishing (CMP) process may be performed. In the CMP process, portions of the one or more diffusion barrier layers and/or the layer of electrically conductive material outside the contact vias and trenches may be removed. Portions of the electrically conductive material in the contact vias and trenches may remain in the semiconductor structure. The trenches filled with the electrically conductive material form electrically conductive lines that connect circuit elements in the semiconductor structure. The contact vias filled with the electrically conductive material provide electrical connections between different layers, as detailed above. The one or more diffusion barrier layers may substantially prevent or at least reduce a diffusion of the electrically conductive material through the interlayer dielectric, which might adversely affect the functionality of the integrated circuit.

For forming the contact vias and trenches in the interlayer dielectric, techniques of photolithography and etching may be employed. Etch processes employed in the formation of contact vias and trenches may include, in particular, dry etch processes, such as reactive ion etching. In such etch processes, the interlayer dielectric may be damaged, in particular when the interlayer dielectric includes a porous low-k or ultra-low-k (ULK) material. Furthermore, etch processes may leave unwanted residuals on surfaces of electrically conductive features provided in lower interconnect levels that are exposed in the etch process.

Residuals on copper surfaces may include polymers and copper oxide. Since the presence of etch residuals on copper surfaces may adversely affect the functionality of an integrated circuit, for example, by increasing RC-delays and/or a likelihood of time dependent dielectric breakdown (TDDB) occurring, it has been proposed to perform one or more cleaning processes after the etching of contact vias and trenches.

Such cleaning processes, however, may have issues associated therewith, which may include modifications of the interlayer dielectric, such as an undesirable increase of the dielectric constant of the interlayer dielectric in the vicinity of its surface and/or its interface with other materials by carbon depletion. Modifications of the interlayer dielectric may lead to RC-delays and even failure of integrated circuits due to time dependent dielectric breakdown.

The present disclosure provides methods wherein the above-mentioned issues may be substantially avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a substrate having a frontside and a backside. An electrically conductive feature including copper is provided at the frontside of the substrate. A low-k interlayer dielectric is provided over the electrically conductive feature. A portion of the interlayer dielectric is etched. In the etch process, a surface of the electrically conductive feature is exposed. A degas process is performed. In the degas process, the semiconductor structure is exposed to a first gas, and the semiconductor structure is heated from the backside and from the frontside. A preclean process is performed. The preclean process includes at least one of exposing the semiconductor structure to a substantially non-ionized second gas and using a plasma created from the second gas.

Another illustrative method disclosed herein includes providing a semiconductor structure. The semiconductor structure includes a substrate having a frontside and a backside. An electrically conductive feature including copper is formed at a frontside of the substrate, and a low-k interlayer dielectric is provided over the electrically conductive feature. A portion of the interlayer dielectric is etched. In the etch process, a surface of the electrically conductive feature is exposed. A degas process is performed. In the degas process, the semiconductor structure is exposed to a substantially non-ionized gas including at least one of hydrogen, nitrogen, a hydrocarbon and ammonia.

A further illustrative method disclosed herein includes providing a semiconductor structure. The semiconductor structure includes a substrate having a frontside and a backside. An electrically conductive feature including copper is provided at the frontside of the substrate. An ultra-low-k interlayer dielectric having a dielectric constant of about 3 or less is provided over the electrically conductive feature. A portion of the interlayer dielectric is etched. In the etch process, a surface of the electrically conductive feature is exposed. A degas process is performed. In the degas process, the semiconductor structure is exposed to argon, and the semiconductor structure is heated from the backside and from the frontside. The semiconductor structure is heated from the initial temperature to approximately a first process temperature during a first phase of the degas process, and the semiconductor structure is maintained at approximately the first process temperature during a second phase of the degas process. A duration of the first phase of the degas process is shorter than about one-half of a total duration of the degas process. The first process temperature is in a range from about 290-310° C. The total duration of the degas process is in a range from about 50-70 seconds. A preclean process is performed. The preclean process includes a first phase wherein the semiconductor structure is exposed to substantially non-ionized hydrogen and a second phase wherein a remote hydrogen plasma is used. A duration of the second phase of the preclean process is in a range from about one-quarter of a total duration of the preclean process to about one-half of a total duration of the preclean process. The total duration of the preclean process is in a range from about 30-50 seconds. During the preclean process, the semiconductor structure is heated to a second process temperature in a range from about 300-320° C.

BRIEF DESCRIPTION OF THE DRAWINGS

The disclosure may be understood by reference to the following description taken in conjunction with the accompanying drawings, in which like reference numerals identify like elements, and in which.

Figure 1:
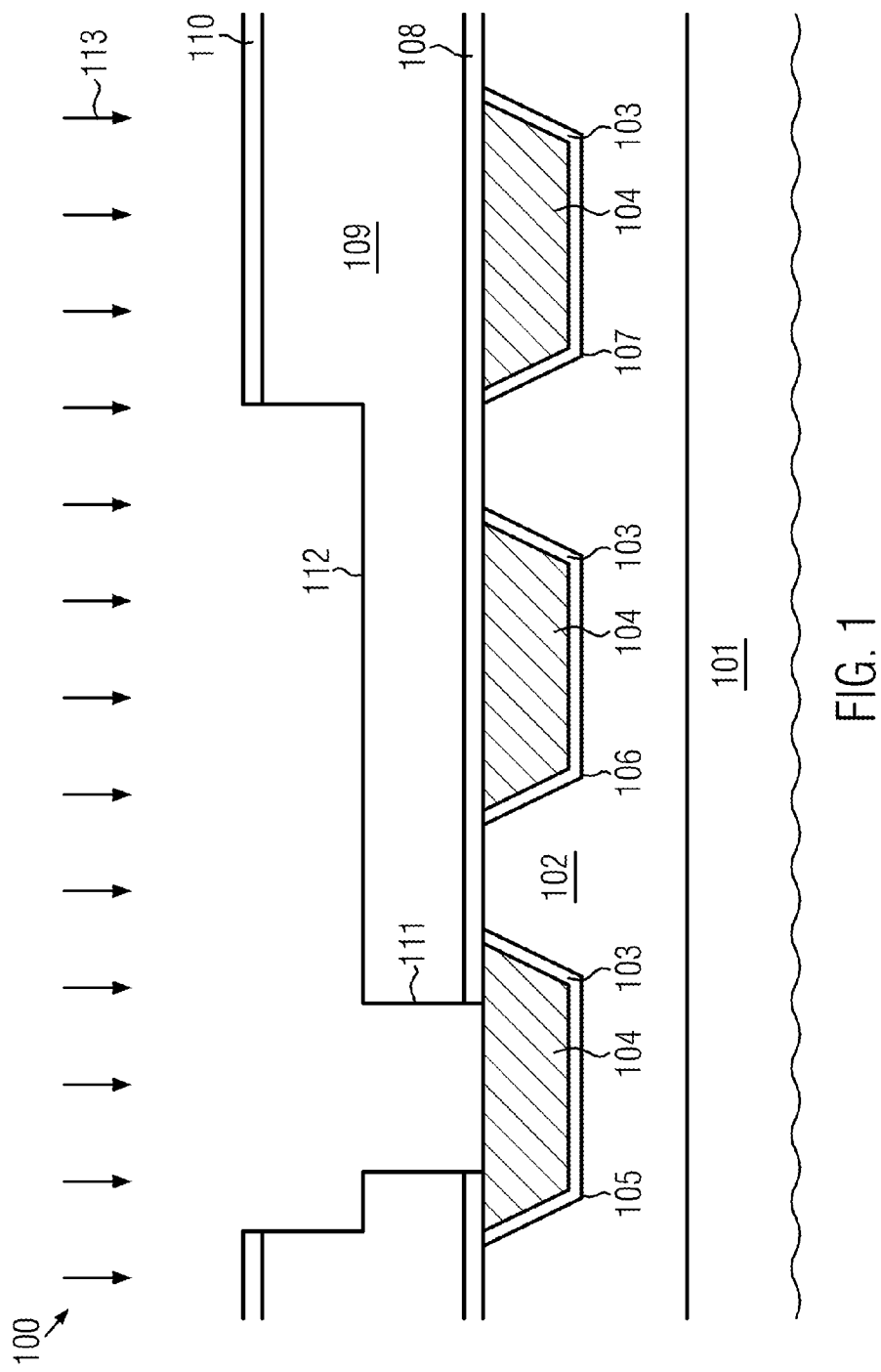
FIGS. 1-3 show schematic cross-sectional views of a semiconductor structure in stages of a method of forming a semiconductor structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides techniques wherein a degas process is performed in a gas including, for example, argon after an etching of an interlayer dielectric which may, in particular, be an ultra-low-k interlayer dielectric. In the degas process, moisture and/or other volatile species may be removed from the semiconductor structure. The degas process may be performed for a relatively short time of less than about 2 minutes, for example, for about 60 seconds or about 45 seconds. Moreover, the degas process may be performed at a relatively high temperature, for example, a temperature in a range from about 250-350° C. This may help to improve the throughput of semiconductor manufacturing processes.

In some embodiments, degas processes may be performed in gases other than argon. For example, the degas process may be performed in a gas including one or more of hydrogen, nitrogen, one or more carbohydrates, ammonia and mixtures thereof. In particular, performing a degas process in a gas including one or more hydrocarbons may help to repair interlayer dielectrics including a low-k dielectric material and/or an ultra-low-k dielectric material. In some embodiments, the gas used in the degas process may be preheated, which may help to improve the effectiveness and/or efficiency of the outgassing.

Embodiments disclosed herein include a preclean process that may be performed after an etching of an interlayer dielectric including a low-k dielectric material and/or an ultra-low-k dielectric material. In particular, the preclean process may be performed after a degas process as described above. In the preclean process, the semiconductor structure may be exposed to a substantially non-ionized gas including, for example, hydrogen, and/or a remote plasma formed from a gas including, for example, hydrogen.

Performing a hydrogen preclean with improved plasma conditions as disclosed herein may improve the cleanliness of a copper surface and may help to reduce a modification and/or degradation of low-k dielectric materials and/or ultra-low-k dielectric materials compared to conventional cleaning processes. This may help to avoid a shift of the k-value of the interlayer dielectric material and/or reduce the likelihood of a time-dependent dielectric breakdown occurring. In some embodiments disclosed herein, a multistep degas and precleaning process may be performed. For example, in a load lock of a semiconductor processing tool, a water outgassing process may be performed, and in another chamber of the semiconductor processing tool, a precleaning process for removing etch residuals may be performed. In further embodiments, the degas process may include a first degas step wherein the semiconductor structure is exposed to a relatively high temperature, and wherein the temperature is relatively quickly increased in a "fast ramp" manner, an intermediate step wherein the temperature is maintained for an amount of time, and a final slow ramp down step. These steps may be performed in the same chamber or in different chambers of the semiconductor processing tool.

FIG. 1 shows a schematic cross-sectional view of a semiconductor structure 100 in a stage of a manufacturing process according to an embodiment. The semiconductor structure 100 includes a substrate 101. The substrate 101 may be a semiconductor substrate, for example, a bulk semiconductor wafer or die formed of a semiconductor material, such as, for example, silicon. Alternatively, the substrate 101 may be a semiconductor-on-insulator (SOI) substrate including a layer of a semiconductor material, for example silicon, formed over a layer of an electrically insulating material such as, for example, silicon dioxide. The layer of electrically insulating material may be provided on a support wafer or a die, which may be a silicon wafer or die. In and on the substrate 101, circuit elements such as, for example, field effect transistors (not shown), may be provided. The circuit elements may be provided at a frontside of the substrate 101. At a backside of the substrate 101 that is opposite the frontside, no circuit elements need to be provided.

The semiconductor structure 100 further includes a first interlayer dielectric 102. The first interlayer dielectric 102 may include a low-k dielectric material having a smaller dielectric constant than silicon dioxide, for example, a dielectric constant that is smaller than about 4. In some embodiments, the low-k dielectric material may be an ultra-low-k material having a dielectric constant that is smaller than about 3. In some embodiments, the first interlayer dielectric 102 may include one or more materials selected from the group of materials including fluorine-doped silicon dioxide, carbon-doped silicon dioxide, porous silicon dioxide, porous fluorine-doped silicon dioxide, porous carbon-doped silicon dioxide and/or a polymeric dielectric material, for example, a polymeric dielectric material including a polyimide, a polynorbornene, a benzozyclobutene, a polytetraflouroethylene, a hydrogen silsesquioxane and/or a methylsilsesquioxane. In further embodiments, the first interlayer dielectric 102 may include a carbon-doped silicon nitride and/or a porous carbon-doped silicon nitride.

The first interlayer dielectric 102 may include one or more electrically conductive features, which may include trenches 105, 106, 107 formed in the first interlayer dielectric 102. The trenches 105, 106, 107 may be filled with an electrically conductive material 104, for example, a metal such as copper or a copper alloy. At a bottom surface and at sidewalls of each of the trenches 105, 106, 107, a diffusion barrier layer 103 may be provided between the electrically conductive material 104 and the first interlayer dielectric layer 102. The diffusion barrier layer 103 may include one or more layers of a diffusion barrier material such as, for example, tantalum, tantalum nitride, tungsten nitride and/or titanium nitride. The diffusion barrier layer 103 may help to prevent a diffusion of copper from the electrically conductive material 104 into the first interlayer dielectric 102 and/or a semiconductor material provided in the substrate 101. Additionally, the diffusion barrier layer 103 may help to improve an adhesion between the electrically conductive material 104 and the first interlayer dielectric 102.

Over the trenches 105, 106, 107 filled with the electrically conductive material 104 and over portions of the first interlayer dielectric 102 adjacent the trenches 105, 106, 107, an etch stop layer 108 may be provided. In some embodiments, the etch stop layer 108 may include silicon nitride, which may also have diffusion barrier properties for the electrically conductive material 104.

Over the etch stop layer 108, a second interlayer dielectric 109 may be provided. The second interlayer dielectric 109 may have features corresponding to those of the first interlayer dielectric 102. In particular, the second interlayer dielectric 109 may include a low-k material and/or an ultra-low-k material. In some embodiments, the second interlayer dielectric 109 and the first interlayer dielectric 102 may be formed of substantially the same material.

In the second interlayer dielectric 109, a trench 112 and a contact via 111 may be provided. The contact via 111 may be provided over one of the trenches 105, 106, 107, for example over the trench 105, and the electrically conductive material 104 provided in the trench 105 may be exposed at a bottom of the contact via 111. The trench 112 does not extend through the second interlayer dielectric 109. Instead, at the bottom of the trench 112, a portion of the second interlayer dielectric 109 may be provided. Adjacent the contact via 111 and the trench 112, a hardmask 110 may be provided over the second interlayer dielectric 109. The hardmask 110 may include silicon dioxide, silicon oxynitride and/or silicon nitride.

The above-described features of the semiconductor structure 100 may be formed as follows. The first interlayer dielectric 102 may be deposited over the substrate 101, in and on which circuit elements such as, for example, field effect transistors, have been formed using techniques of manufacturing circuit elements in integrated circuits. The first interlayer dielectric 102 need not be deposited directly over the substrate 101, as shown in FIG. 1. In some embodiments, further interlayer dielectrics (not shown), which may include electrically conductive features such as trenches similar to trenches 105, 106, 107 and contact vias filled with electrically conductive material, may be provided between the first interlayer dielectric 102 and the substrate 101.

For depositing the first interlayer dielectric 102, deposition techniques such as chemical vapor deposition, plasma enhanced chemical vapor deposition and/or spin coating may be employed.

In the first interlayer dielectric 102, the trenches 105, 106, 107 may be formed. Contact vias (not shown) may also be formed. The trenches 105, 106, 107 and the contact vias may be formed by means of patterning techniques that may include photolithography and etching. In some embodiments, a trench-first approach may be used, wherein the trenches 105, 106, 107 are formed before a formation of contact vias in the first interlayer dielectric 102, or a via-first approach may be employed, wherein contact vias in the first interlayer dielectric are formed before the formation of the trenches 105, 106, 107.

For forming the trenches 105, 106, 107 and, optionally, contact vias in the first interlayer dielectric 102, masks, for example photoresist masks or hardmasks, may be used, and etch processes, such as reactive ion etching, may be employed.

In some embodiments, after the etch processes employed for the formation of the trenches 105, 106, 107 and, optionally, contact vias in the first interlayer dielectric 102, wet cleaning processes, as well as degas processes and preclean processes, may be performed. Features of the wet cleaning processes, degas processes and precleaning processes may correspond to those of processes that are performed after the formation of the contact via 111 and the trench 112, which will be described below.

After the formation of the trenches 105, 106, 107 and contact vias in the first interlayer dielectric 102, the diffusion barrier layer 103 may be deposited by means of deposition techniques, such as chemical vapor deposition, plasma enhanced chemical vapor deposition and/or physical vapor deposition. Thereafter, the electrically conductive material 104 may be deposited, for example, by means of electroplating. Then, a planarization process such as, for example, chemical mechanical polishing, may be performed for removing portions of the diffusion barrier layer 103 and the electrically conductive material 104 outside the trenches 105, 106, 107 and the contact vias in the first interlayer dielectric 102.

Thereafter, the etch stop layer 108, the second interlayer dielectric 109, a layer of a material of the hardmask 110 and optional further layers of hardmask material (not shown) may be deposited. Techniques for depositing the second interlayer dielectric 109 may correspond to the techniques used for forming the first interlayer dielectric 102 described above. For depositing the etch stop layer 108, the layer of hard mask material from which the hardmask 110 will be formed, and optional further layers of hardmask material, deposition techniques such as chemical vapor deposition, plasma enhanced chemical vapor deposition and/or physical vapor deposition may be employed.

Thereafter, etch processes, such as, for example, reactive ion etch processes, may be performed for forming the contact via 111 and the trench 112. For protecting portions of the second interlayer dielectric 109 which are not to be etched in these etch processes, photoresist masks and/or hardmasks may be employed. In particular, the hardmask 110 may be used for protecting portions of the second interlayer dielectric 109 below the hardmask 110 during an etch process wherein the trench 112 is formed. In some embodiments, a trench-first approach may be used for forming the contact via 111 and the trench 112, wherein the etch process for forming the trench 112 is performed before the etch process for forming the contact via 111. In other embodiments, a via-first approach may be used, wherein the etch process for forming the contact via 111 is performed before the etch process for forming the trench 112.

Further features of the formation of the contact via 111 and the trench 112 may correspond to features of known processes for forming contact vias and trenches in interlayer dielectrics of semiconductor structures.

In some embodiments, after the etch processes performed for forming the contact via 111 and the trench 112, photoresist removal processes may be performed. Additionally, wet cleaning processes may be performed. Examples of wet cleaning processes that may be performed after the formation of the contact via 111 and the trench 112 include exposing the semiconductor structure 100 to an aqueous solution of hydrogen fluoride, an aqueous solution including hydrogen fluoride and an oxidation inhibitor and/or an EKC cleaning chemistry.

Thereafter, a degas process may be performed, schematically denoted by arrows 113 in FIG. 1. The degas process 113 may be performed in a chamber of a semiconductor processing tool. The semiconductor processing tool may include devices for providing a gas ambient in the chamber wherein the degas process 113 is performed. The devices may include, for example, pumps for removing air from the chamber, and one or more gas supplies for supplying one or more gases to the chamber. Additionally, heating devices may be provided for heating the semiconductor structure 100 during the degas process 113. Heating devices that may be employed for heating the semiconductor structure 100 may include a heated wafer chuck on which the semiconductor structure 100 may be placed during the degas process 113, and one or more lamps for irradiating the semiconductor structure 100.

The semiconductor structure 100 may be placed on the wafer chuck such that the backside of the substrate 101, that is opposite to the frontside on which the interlayer dielectrics 102, 109 and the trenches 105, 106, 107 filled with the electrically conductive material 104 are provided, rests on the wafer chuck. Thus, the frontside of the substrate 101 is on an opposite side of the substrate 101 than the wafer chuck. The semiconductor structure 100 may be heated from the backside of the substrate 101 due to the contact between the backside of the substrate 101 and the heated wafer chuck.

Additionally, the semiconductor structure 100 may be heated from the frontside of the substrate 101 by irradiation of the semiconductor structure 100 with electromagnetic radiation (for example, visible or infrared radiation) by means of one or more lamps. In particular, during the degas process, the semiconductor structure 100 may be heated both from the backside of the substrate 101 and from the frontside of the substrate 101. The semiconductor structure 100 need not be heated both from the frontside and the backside of the substrate 101 during the whole degas process. In some embodiments, the semiconductor structure may be heated from the frontside of the substrate 101 during an initial phase of the degas process 113, and may be heated from the backside of the substrate 101 only in a later phase of the degas process 113. Alternatively, the semiconductor structure 100 may be heated both from the frontside and from the backside of the substrate 101 during the entire degas process 113. In further embodiments, the semiconductor structure 100 may be heated from the backside only during the entire degas process 113.

The degas process 113 may have a first phase and a second phase. During the first phase, the semiconductor structure 100 may be heated from an initial temperature to approximately a process temperature of the degas process 113. During the second phase of the degas process 113, the semiconductor structure 100 may be maintained at approximately the process temperature. A total duration of the degas process 113 may be approximately equal to a sum of the duration of the first phase and the duration of the second phase. By heating the semiconductor structure 100 both from the backside and from the frontside during at least the first phase of the degas process 113, a duration of the first phase of the degas process of less than about one-half of the total duration of the degas process may be obtained, even in the case of a relatively short duration of the degas process 113.

Figure 4:
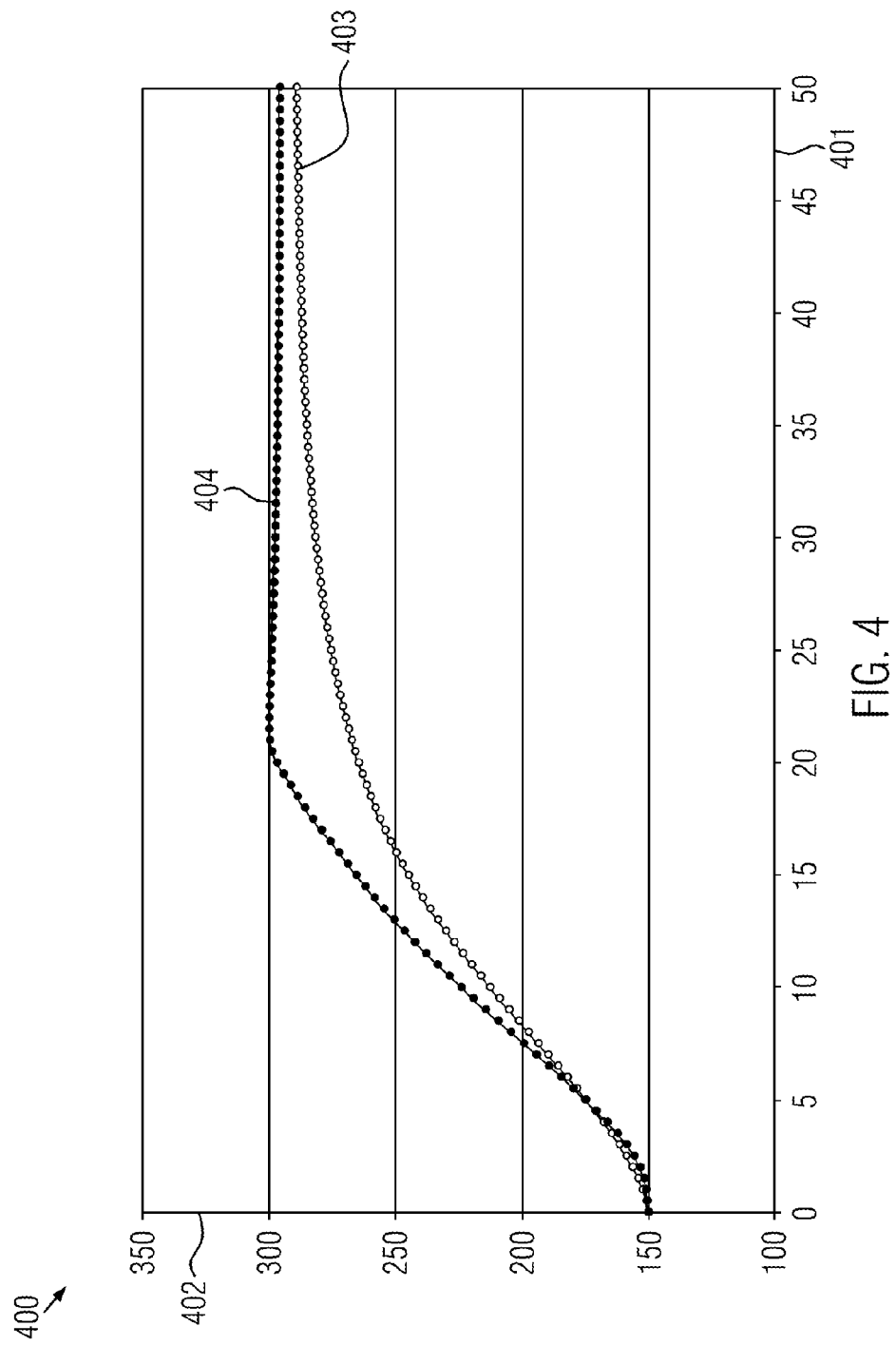
FIG. 4 shows a time-dependency of temperature of semiconductor structures during degas processes.

FIG. 4 shows a diagram 400 illustrating measurements of temperature by means of a thermocouple wafer that was provided in a semiconductor processing tool that may be employed for the degas process 113. The temperature measurements obtained by means of the thermocouple wafer are representative of the temperature of the semiconductor structure 100 that may be obtained when the semiconductor structure 100 is provided in the semiconductor processing tool.

In the diagram 400, a horizontal coordinate axis 401 denotes time in seconds, and a vertical coordinate axis 402 denotes the average temperature of the thermocouple wafer in degrees Centigrade. A curve 403 shows the dependence of the average temperature of the thermocouple wafer on time when the thermocouple wafer is heated from the backside only by means of the heated wafer chuck, and curve 404 illustrates the dependence of the average temperature of the thermocouple wafer on time when the thermocouple wafer is simultaneously heated from the backside by means of the heated wafer chuck, and heated from the frontside by irradiation with electromagnetic radiation.

In the example shown in FIG. 4, the initial temperature of the thermocouple wafer was 150° C., and the process temperature employed was 300° C. As can be seen from FIG. 4, by heating the thermocouple wafer both from the backside and from the frontside, the thermocouple wafer may be heated from the initial temperature to approximately the process temperature in about 20 seconds, whereas, when the thermocouple wafer is heated from the backside only, the temperature of the test semiconductor structure is still lower than the process temperature of 300° C. after about 50 seconds.

In some embodiments, the process temperature of the degas process 113 may be in a range from about 250-350° C., within a range from about 275-325° C. and/or within a range from about 290-310° C. For example, the process temperature of the degas process 113 may be about 300° C. The initial temperature of the semiconductor structure 100 at the beginning of the degas process 113 may be within a range from about 100-200° C., within a range from about 125-175° C. and/or within a range from about 140-160° C. For example, the initial temperature of the semiconductor structure may be about 150° C. For providing the above-mentioned initial temperature of the semiconductor structure 100, a preheating process may be performed before the degas process 113. In some embodiments, the preheating process may include exposing the semiconductor structure 100 to a preheated gas, wherein the gas may be a gas used in the degas process, as will be described below.

In other embodiments, the initial temperature of the semiconductor structure 100 at the beginning of the degas process 113 may be approximately room temperature, for example, about 20° C.

The total duration of the degas process 113 may be less than about 120 seconds. In some embodiments, the total duration of the degas process may be within a range from about 30-90 seconds, within a range from about 40-80 seconds and/or within a range from about 50-70 seconds. For example, the total duration of the degas process 113 may be about 60 seconds. In some embodiments, a shorter total duration of the degas process 113 of about 45 seconds may be employed.

As already mentioned above, during the degas process 113, the semiconductor structure 100 may be exposed to a gas. In some embodiments, the semiconductor structure 100 may be exposed to argon during the degas process 113. For example, the semiconductor structure 100 may be exposed to substantially pure argon. In other embodiments, gases other than argon may be used. For example, the semiconductor structure 100 may be exposed to hydrogen ($H_2$), nitrogen ($N_2$) and/or a mixture of hydrogen and nitrogen. In further embodiments, the semiconductor structure 100 may be exposed to one or more hydrocarbons such as, for example, methane ($CH_4$), ethane ($C_2H_6$), ethylene ($C_2H_4$), propane ($C_3H_8$), propylene ($C_3H_6$), butane ($C_4H_{10}$) and/or butadiene ($C_4H_8$). Providing the semiconductor structure 100 in a gas including a hydrocarbon during the degas process 113 may help to provide a repair of damages of the second interlayer dielectric 109 that have been caused by the etch processes employed for forming the contact via 111 and the trench 112 and/or dry or wet cleaning processes performed after the etch processes. In further embodiments, the semiconductor structure 100 may be exposed to a gas including ammonia ($NH_3$) during the degas process 113. Mixtures of the above-mentioned gases may also be employed. In some embodiments, the semiconductor structure 100 may be exposed to a gas including one or more of argon, hydrogen, nitrogen, a hydrocarbon and ammonia during the degas process 113.

The pressure of the gas may be in a range from about 7-11 Torr, for example, about 9 Torr. In some embodiments, at the beginning of the degas process 113, the temperature of the gas wherein the semiconductor structure 100 is provided may be approximately equal to the initial temperature described above. In other embodiments, the gas wherein the semiconductor structure 100 is provided during the degas process 113 may be preheated to a higher temperature than the initial temperature described above. For example, the gas may be preheated to a temperature that is approximately equal to the process temperature of the degas process 113. Thus, an even faster heating of the semiconductor structure 100 to approximately the process temperature of the degas process 113 may be obtained.

In the degas process 113, moisture, such as, for example, residues of water employed in wet chemical cleaning solutions applied to the semiconductor structure 100 after the etch processes performed for forming the contact via 111 and the trench 112, may be removed. Additionally, in the degas process 113, chemical compounds such as, for example, oxygen and carbon dioxide may be removed from the semiconductor structure 100, wherein the oxygen may be present in atomic or molecular form. Oxygen and/or carbon dioxide may, for example, be present on the semiconductor structure 100 due to adsorption of gases from ambient air or from process gases used in the manufacturing of the semiconductor structure 100 by the semiconductor structure 100. In particular, in embodiments wherein the interlayer dielectrics 102, 109 are porous, which may help to reduce the dielectric constant of the interlayer dielectrics 102, 109, moisture, as well as gases such as oxygen and/or carbon dioxide, may be present in the pores and/or at the walls of the pores, and may be removed from the second interlayer dielectric 109 during the degas process 113.

However, exposing the semiconductor structure 100 to a relatively high temperature and/or performing the degas process 113 for a relatively long time may adversely affect the second interlayer dielectric 109. Moreover, performing the degas process for a relatively long time may increase the costs of the manufacturing process, since, thus, the number of semiconductor structures that may be processed per time unit is reduced.

By using the above-mentioned ranges of temperature and duration of the degas process 113, an efficient removal of moisture, oxygen and/or carbon dioxide from the semiconductor structure 100 may be obtained, while maintaining a relatively short duration of the degas process 113, and substantially avoiding or at least reducing a likelihood of damages of the interlayer dielectrics 102, 109 occurring.

Figure 5:
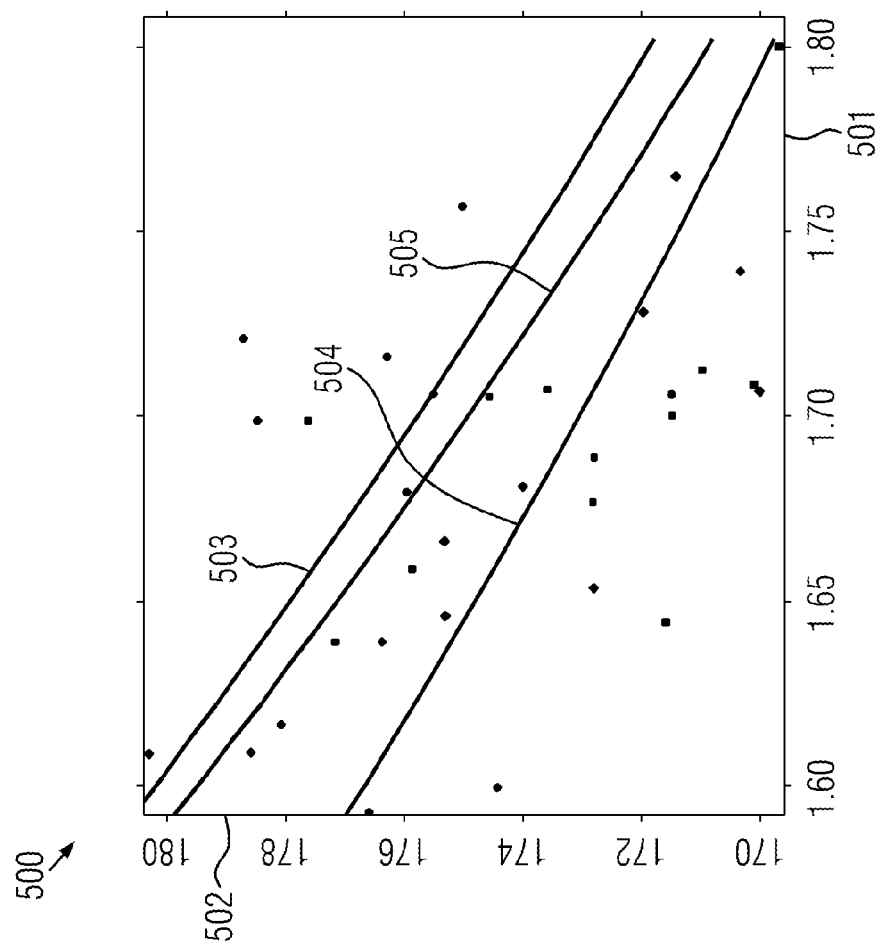
FIG. 5 shows results of measurements of resistances and capacities of electrically conductive lines in semiconductor structures.

FIG. 5 shows a diagram 500 illustrating measurements of a resistance and a capacity of electrically conductive lines in a semiconductor structure similar to the semiconductor structure 100 described above. In this semiconductor structure, test structures were provided, wherein electrically conductive lines were arranged in a serpentine and comb pattern. A horizontal coordinate axis 501 denotes the resistance of the electrically conductive lines in the test structures in the unit ohm per micrometer ($\Omega/\mu m$), and a vertical coordinate axis 502 denotes the capacity of the electrically conductive lines in the unit attofarad per micrometer ($aF/\mu m$). In the diagram 500, results of measurements of the resistance and the capacity of semiconductor structures wherein a degas process denoted as "Degas 1" in the following was performed, wherein the semiconductor structure was heated only from the backside, and wherein the process temperature of the degas process was 300° C., are denoted by circles and squares. The circles show measurements at semiconductor structures wherein the total duration of the degas process was 45 seconds, and the squares show results of measurements at semiconductor structures wherein the total duration of the degas process was 300 seconds.

Moreover, in FIG. 5, diamonds show results of measurements performed at semiconductor structures wherein a degas process denoted as "Degas 2" in the following was performed, wherein the semiconductor structure was heated both from the frontside and from the backside, wherein the process temperature of the degas process was 300° C. and wherein the degas process was performed for 300 seconds.

In FIG. 5, curve 503 shows a fit of the data obtained for Degas 1 with a total duration of the degas process of 45 seconds (circles), curve 504 shows a fit of the measurements obtained for Degas 1 with a total duration of the degas process of 300 seconds (squares), and curve 505 shows a fit of the measurements obtained for Degas 2 with a total duration of the degas process of 300 seconds (diamonds).

As can be seen from FIG. 5, the differences between the results of the measurements are relatively small compared to the fluctuations of the measurements. For Degas 1, an increase of the duration of the degas process from 45 seconds to 300 seconds may lead to a reduction of the capacity of the electrically conductive lines obtained for a given resistance, indicating that a duration of 45 seconds may be insufficient for performing a complete degassing of the semiconductor structure when the semiconductor structure is heated only from the backside.

From curve 505, it can be seen that Degas 2 may allow obtaining values of capacity and resistance that are comparable to those obtained for Degas 1. Further experiments (not shown in FIG. 5) have shown that degas process Degas 2, wherein the semiconductor structure is heated both from the frontside and from the backside, may help to obtain appropriate values of the capacity and resistance even for a shorter duration of the degas process of only 60 seconds or less.

Figure 2:
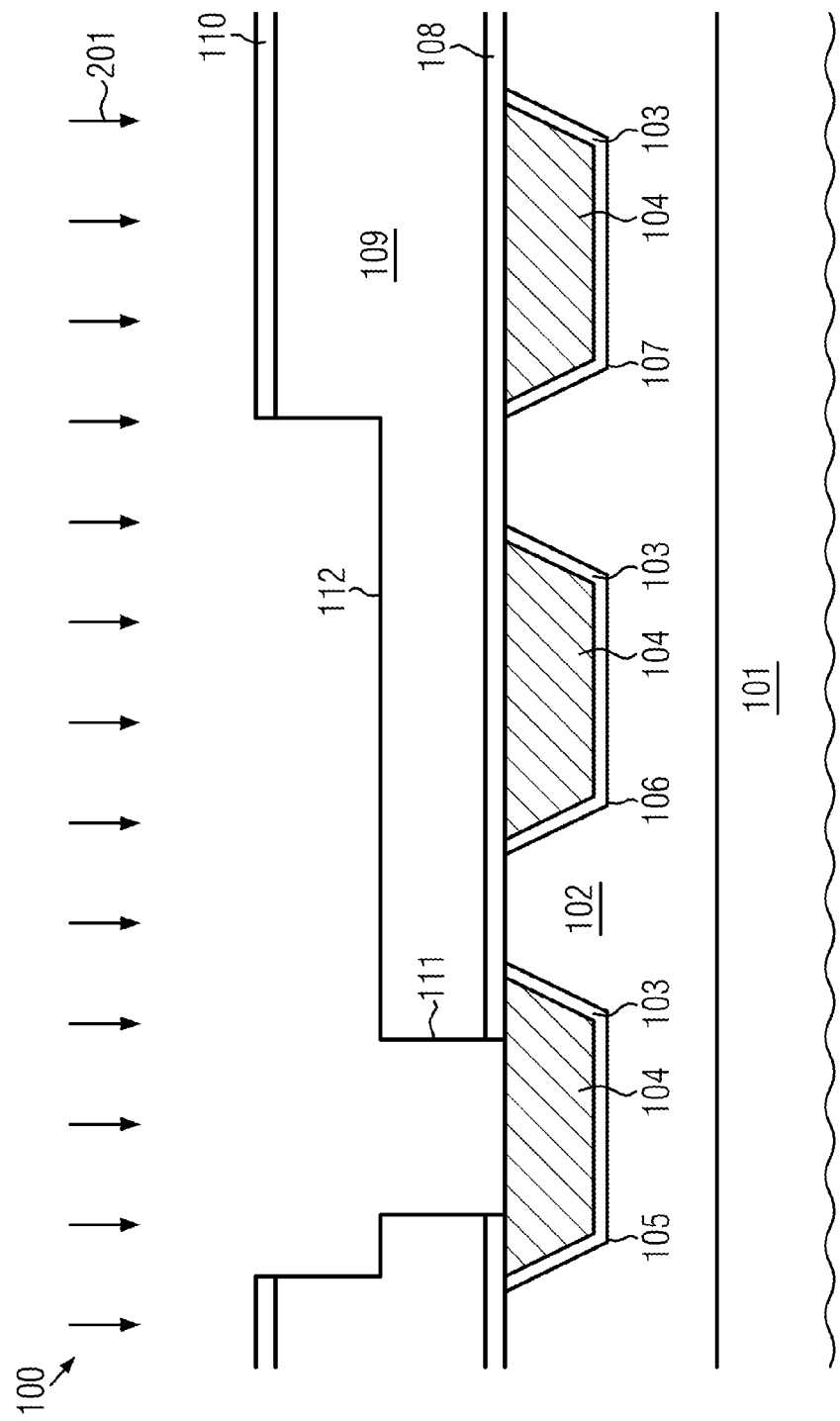

FIG. 2 shows a schematic cross-sectional view of the semiconductor structure 100 in a later stage of the manufacturing process. After the degas process 113, a preclean process may be performed. In FIG. 2, the preclean process is schematically denoted by arrows 201. In the preclean process 201, the semiconductor structure 100 may be exposed to gas including hydrogen.

The preclean process 201 may be performed in a chamber of a semiconductor processing tool. In some embodiments, the preclean process 201 may be performed in the same chamber of the semiconductor processing tool as the degas process 113. In other embodiments, the degas process 113 and the preclean process 201 may be performed in different chambers of the semiconductor processing tool. For example, in some embodiments, the degas process 113 may be performed in a load lock of the semiconductor processing tool, and the preclean process 201 may be performed in another chamber of the semiconductor processing tool that is separate from the load lock. The preclean process 201 may include a first phase and a second phase. In the first phase, the semiconductor structure 100 may be exposed to the gas employed in the preclean process 201 in substantially non-ionized form. For example, in embodiments wherein the semiconductor structure 100 is exposed to hydrogen in the preclean process 201, the semiconductor structure 100 may be exposed to substantially non-ionized hydrogen in the first phase of the preclean process 201.

In the second phase of the preclean process 201, the semiconductor structure 100 may be exposed to a plasma created from the gas used in the preclean process 201. For example, in embodiments wherein the gas used in the preclean process 201 includes hydrogen, the semiconductor structure 100 may be exposed to a hydrogen plasma in the second phase of the preclean process 201.

In some embodiments, the plasma employed in the second phase of the preclean process 201 may be a remote plasma. In remote plasma processing, the plasma may be created from the gas used in the preclean process 201 by an electric discharge, wherein the electric discharge is provided at a distance to a surface of the semiconductor structure 100. After the creation of the plasma, the plasma may be supplied to the semiconductor structure 100. Using a remote plasma in the second phase of the preclean process 201 may help to avoid damages of the semiconductor structure 100 by energetic ions.

In other embodiments, the second phase of the preclean process 201 may be omitted, and the semiconductor structure 100 may be exposed to a substantially non-ionized gas during the entire preclean process. In further embodiments, the first phase of the preclean process 201 may be omitted, and the semiconductor structure 100 may be exposed to a plasma during the entire preclean process. During the preclean process 201, the semiconductor structure 100 may be heated to a process temperature of the preclean process 201. The process temperature of the preclean process 201 may be in a range from about 260-360° C., within a range from about 285-335° C. and/or within a range from about 300-320° C. For example, the process temperature of the preclean process 201 may be about 310° C.

The pressure of the gas used in the preclean process 201 may be in a range from about 8-12 Ton, for example, about 10 Ton, when a substantially non-ionized gas is used, for example, during the first phase of the preclean process 201, and the pressure may be in a range from about 80-140 mTorr, for example, about 110 mTorr, when a plasma is used, for example, during the second phase of the preclean process 201. In embodiments wherein the preclean process 201 has a first phase and a second phase as described above, a total duration of the preclean process 201 may be approximately equal to a sum of a duration of the first phase of the preclean process 201, wherein a substantially non-ionized gas is used, and a duration of the second phase of the preclean process 201, wherein a plasma created from the gas employed in the preclean process 201 is used.

The duration of the second phase of the preclean process 201 may be within a range from about one-fourth of the total duration of the preclean process 201 to about three-fourths of the total duration of the preclean process 201 and/or within a range from about one-third of the total duration of the preclean process 201 to about two-thirds of the total duration of the preclean process 201. For example, the duration of the second phase of the preclean process 201 may be approximately one-third of the total duration of the preclean process 201, or it may be approximately one-half of the total duration of the preclean process.

The total duration of the preclean process 201 may be in a range from about 20-60 seconds and/or in a range from about 30-50 seconds. For example, the total duration of the preclean process 201 may be about 40 seconds.

In the following, a preclean process 201 wherein no plasma is applied, and wherein the semiconductor structure 100 is exposed to substantially non-ionized hydrogen for about 40 seconds at a temperature of about 310° C. will be denoted as "Preclean 1." A preclean process 201 wherein the semiconductor structure 100 is exposed to substantially non-ionized hydrogen for 30 seconds, and is exposed to a remote hydrogen plasma for about 10 seconds will be denoted as "Preclean 2," a preclean process 201 wherein the semiconductor structure 100 is exposed to substantially non-ionized hydrogen for about 20 seconds and to a remote hydrogen plasma for about 20 seconds will be denoted as "Preclean 3," and a preclean process 201 wherein the semiconductor structure 100 is exposed to substantially non-ionized hydrogen for about 10 seconds and to a remote hydrogen plasma for about 30 seconds will be denoted as "Preclean 4." Similar to Preclean 1, in Preclean 2, 3 and 4, the process temperature of the preclean process 201 is about 310° C.

Figure 6:
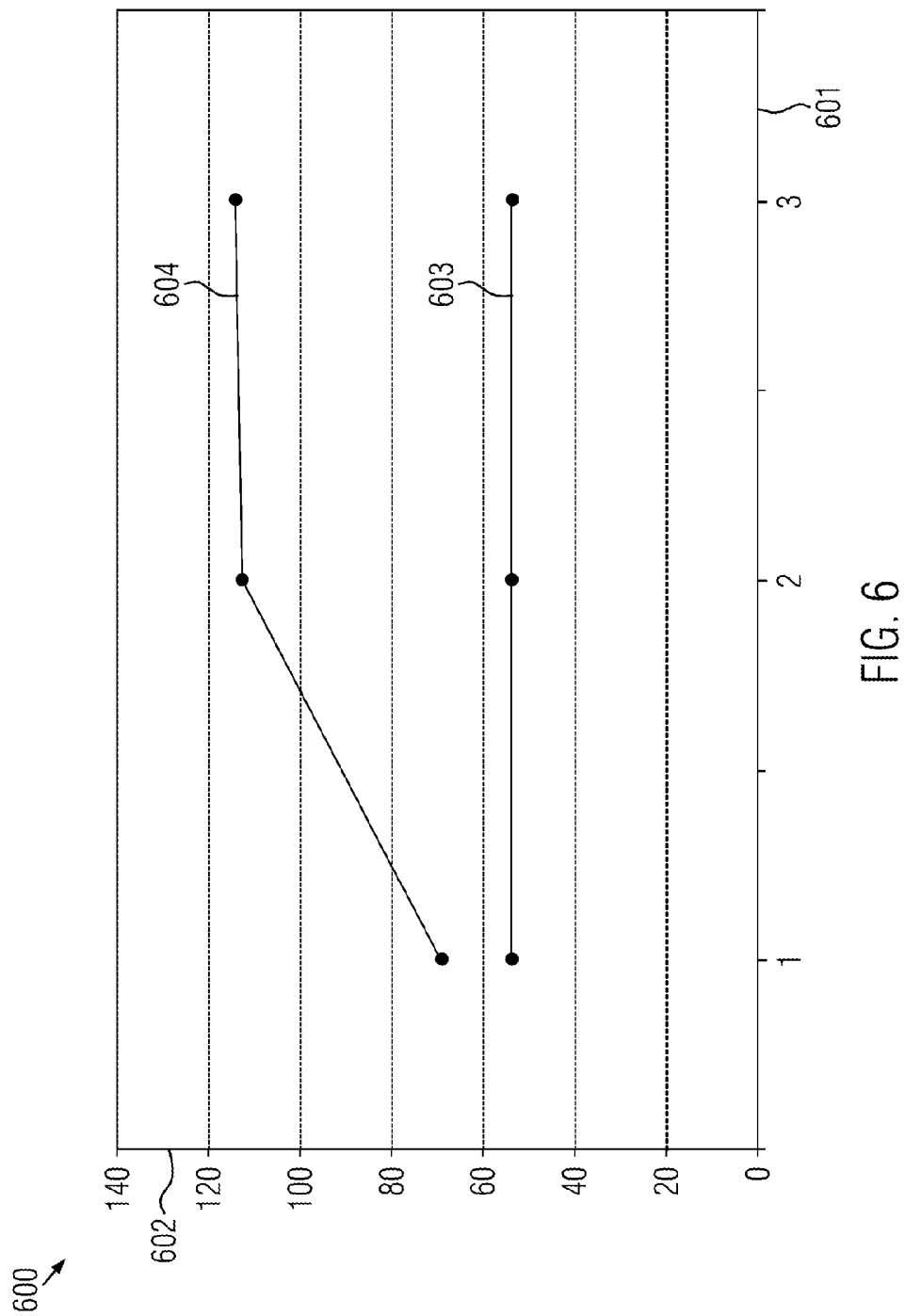
FIG. 6 shows results of measurements of reflectivities of surfaces of electrically conductive materials in semiconductor structures.

FIG. 6 shows results of measurements of the influence of parameters of the preclean process 201 on the reflectivity of surfaces of electrically conductive features including copper such as, for example, surfaces of the electrically conductive material 104 in the trench 105 that is exposed at the bottom of the contact via 111. In the diagram 600 shown in FIG. 6, a horizontal coordinate axis 601 denotes different processes. A preclean process in accordance with process Preclean 1 is labeled "1," a preclean process in accordance with process Preclean 2 is labeled "2" and a preclean process in accordance with process Preclean 3 is labeled "3." In all the examples shown in FIG. 6, before the preclean process, a degas process in accordance with process Degas 1 described above has been performed.

A vertical coordinate axis 602 denotes a ratio between a reflectivity of the copper surface and the reflectivity of silicon adjacent the copper surface. The set of data points denoted by reference numeral 603 shows results of measurements of the reflectivity before the preclean process, and the set of data points denoted by reference numeral 604 shows the results of measurements of the reflectivity after the preclean process.

As can be seen from FIG. 6, performing a preclean process in accordance with preclean process 201 described above with reference to FIG. 2 may increase the reflectivity of the copper surface, which indicates a removal of copper oxide from the copper surface. Moreover, from FIG. 6 it can be seen that performing a second phase of the preclean process wherein the semiconductor structure is exposed to a remote plasma (data points labeled "2" and "3" in FIG. 6) may help to obtain a further improvement of the reflectivity of the copper surface compared to embodiments wherein no remote plasma is used (data points labeled "1" in FIG. 6), which is indicative of an even better removal of copper oxide from the copper surface.

Measurements of capacity and resistance, similar to the measurements described above with reference to FIG. 5, have shown that variations between the values of capacity and resistance obtained with preclean processes Preclean 1, Preclean 2, Preclean 3 and Preclean 4 are relatively small compared to fluctuations between different measurements. Thus, for each of the preclean processes, in particular for preclean processes wherein the semiconductor structure 100 is exposed to a remote plasma in a second phase of the preclean process, desirable values of capacity and resistance may be obtained.

Figure 7:
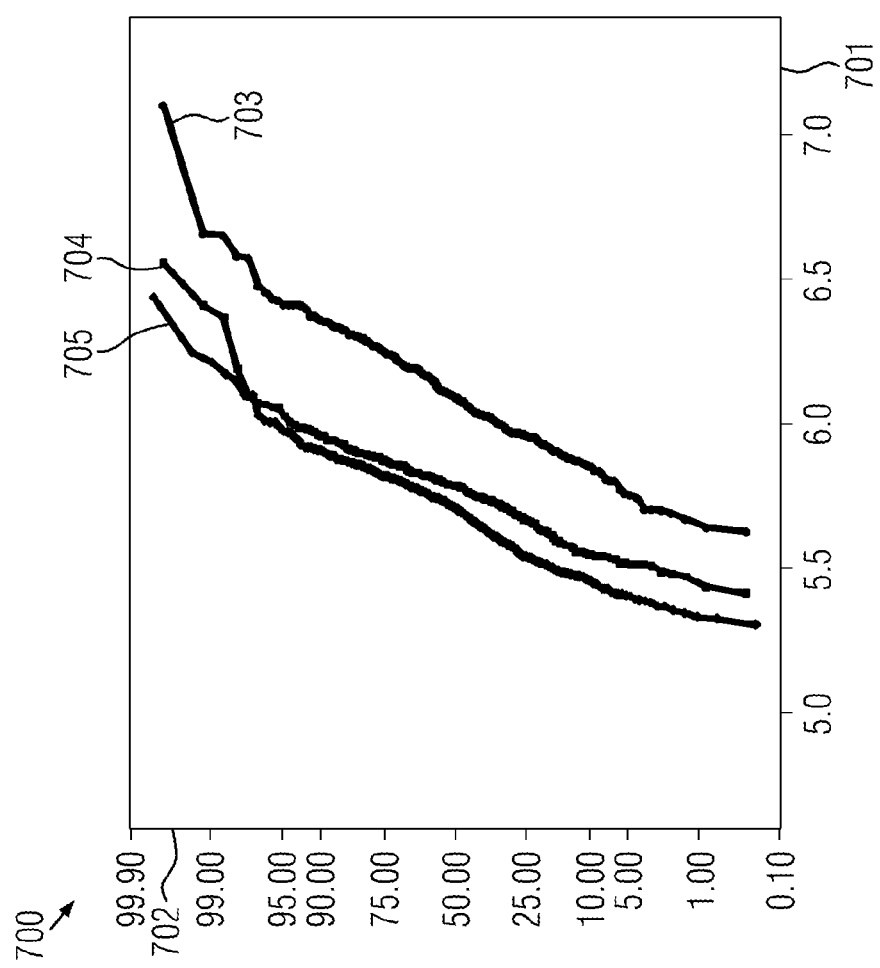
FIG. 7 shows cumulative probability distributions of contact resistances measured in semiconductor structures.

FIG. 7 shows a diagram illustrating results of measurements of a cumulative probability distribution of a contact resistance of electrically conductive features. In FIG. 7, a horizontal coordinate axis 701 denotes contact resistance in the unit ohm (Ω), and a vertical coordinate axis 702 denotes a cumulative probability of the contact resistance. The cumulative probability of a value of the contact resistance is a likelihood that the contact resistance is smaller than the value of the contact resistance.

Curve 703 denotes results of measurements obtained when only degas process Degas 1 was performed and no preclean process was performed, curve 704 shows results of measurements wherein degas process Degas 2 and preclean process Preclean 2 were performed, and curve 705 shows results of measurements wherein a degas process Degas 3 and preclean process Preclean 2 were performed. In the degas process Degas 3, the process temperature was about 350° C., the semiconductor structure was heated both from the backside and from the frontside, and the total duration of the degas process was about 60 seconds.

As can be seen from FIG. 7, performing a preclean process wherein the semiconductor structure is exposed to a substantially non-ionized hydrogen gas during the first phase of the preclean process, and is exposed to a remote hydrogen plasma during a second phase of the preclean process may reduce the contact resistance of electrically conductive features.

Figure 3:
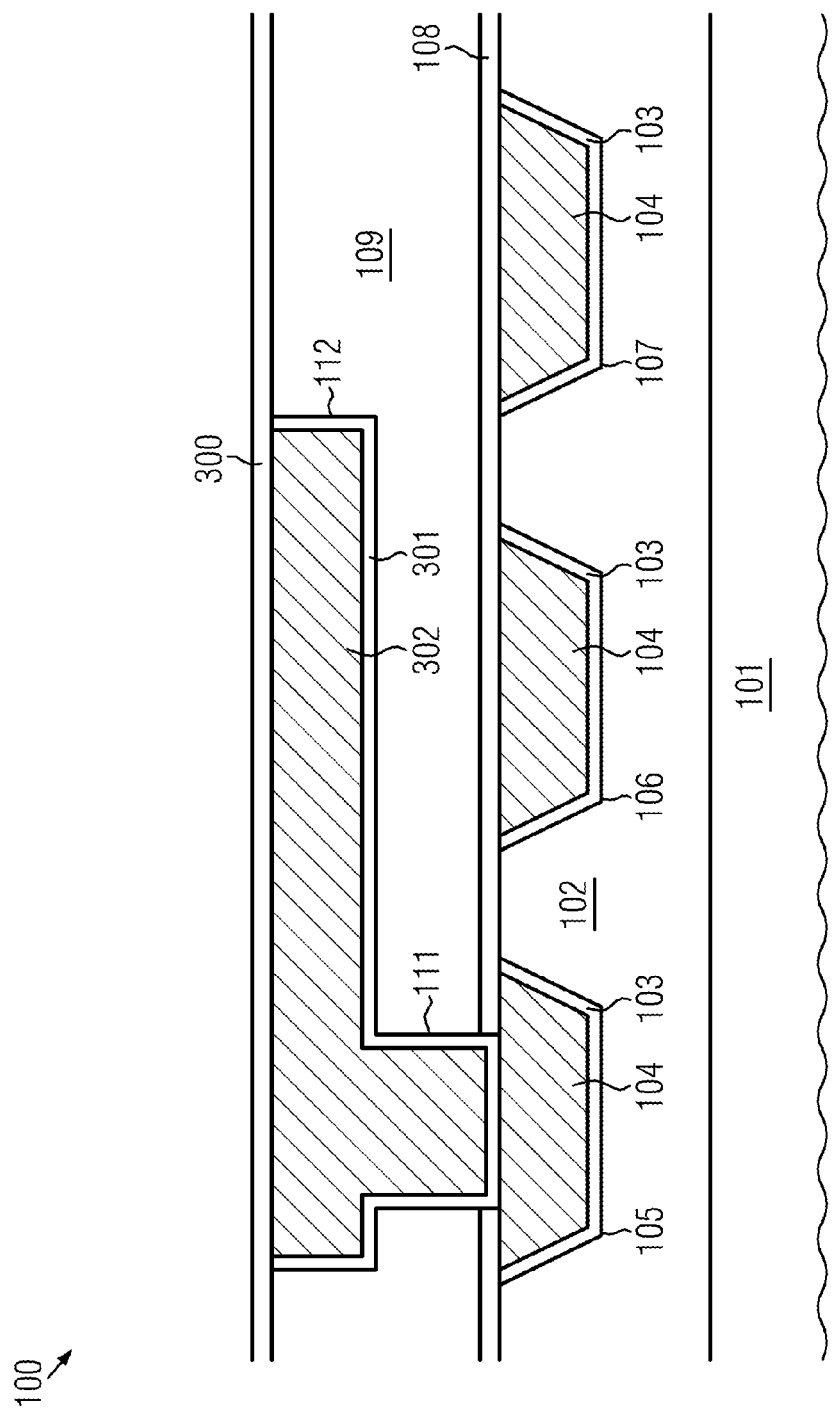

FIG. 3 shows a schematic cross-sectional view of the semiconductor structure 100 in a later stage of the manufacturing process. After the degas process 113 and the preclean process 201, a diffusion barrier layer 301 and a layer 302 of an electrically conductive material, for example, an electrically conductive material including copper, such as copper or a copper alloy, may be deposited over the semiconductor structure 100. Features of the diffusion barrier layer 301 may correspond to features of the diffusion barrier layer 103 described above, and methods similar to the methods used for the formation of the diffusion barrier layer 103 may be used for the formation of the diffusion barrier layer 301. Features of the layer 302 of electrically conductive material may correspond to features of the electrically conductive material 104, and corresponding methods may be used for its formation.

After the deposition of the diffusion barrier layer 301 and the layer 302 of electrically conductive material, a planarization process, for example a chemical mechanical polishing process, may be performed for removing portions of the diffusion barrier layer 301 and the layer 302 of electrically conductive material outside the contact via 111 and the trench 112. Moreover, in the planarization process, the hardmask 110 may be removed. In other embodiments, portions of the hardmask may remain on the semiconductor structure 100.

Thereafter, an etch stop layer 303 may be deposited. Features of the etch stop layer 303 may correspond to features of the etch stop layer 108, and corresponding methods may be used for its formation.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a semiconductor structure, the semiconductor structure comprising a substrate having a frontside and a backside, an electrically conductive feature comprising copper provided at said frontside of said substrate and a low-k interlayer dielectric provided over said electrically conductive feature;
   etching a portion of said interlayer dielectric, a surface of said electrically conductive feature being exposed in the etch process;
   performing a degas process, wherein said semiconductor structure is exposed to a first gas, and wherein said semiconductor structure is heated from at least one of said backside and said frontside of said substrate; and after performing said degas process, performing a preclean process to remove etch residuals from said frontside of said substrate, wherein performing said preclean process comprises performing at least a first preclean phase by exposing said semiconductor structure to a second gas that is in substantially non-ionized form.

2. The method of claim 1, wherein performing said preclean process further comprises performing a second preclean phase by exposing said semiconductor structure to a plasma created from said second gas, said second preclean phase being performed after said first preclean phase.

3. The method of claim 1, wherein said first gas comprises at least one of argon, hydrogen, nitrogen, a hydrocarbon and ammonia.

4. The method of claim 3, wherein said semiconductor structure is heated from an initial temperature to approximately a first process temperature during a first phase of said degas process, and wherein said semiconductor structure is maintained at approximately said first process temperature during a second phase of said degas process, a duration of said first phase of said degas process being shorter than about one half of a total duration of said degas process.

5. The method of claim 4, wherein said first process temperature is at least one of within a range from about 250-350° C., within a range from about 275-325° C., within a range from about 290-310° C., and approximately equal to 300° C.

6. The method of claim 5, wherein said initial temperature is at least one of within a range from about 100-200° C., within a range from about 125-175° C., within a range from about 140-160° C., and approximately equal to 150° C.

7. The method of claim 6, further comprising a preheating process wherein said semiconductor structure is heated from about room temperature to said initial temperature before said degas process.

8. The method of claim 4, wherein said total duration of said degas process is less than about 120 seconds.

9. The method of claim 8, wherein said total duration of said degas process is at least one of within a range from about 30-90 seconds, within a range from about 40-80 seconds, within a range from about 50-70 seconds, approximately equal to 45 seconds and approximately equal to 60 seconds.

10. The method of claim 2, wherein said second gas comprises hydrogen.

11. The method of claim 10, wherein said plasma created from said second gas is a remote plasma.

12. The method of claim 11, wherein a duration of said second phase of said preclean process is at least one of within a range from about one-fourth of a total duration of said preclean process to about three-fourths of said total duration of said preclean process, within a range from about one-third of said total duration of said preclean process to about two-thirds of said total duration of said preclean process, approximately equal to one-third of said total duration of said preclean process and approximately equal to one-half of said total duration of said preclean process.

13. The method of claim 12, wherein said semiconductor structure is heated from said backside during said preclean process.

14. The method of claim 13, wherein said semiconductor structure is heated to a second process temperature during said preclean process, wherein said second process temperature is at least one of within a range from about 260-360° C., within a range from about 285-335° C., within a range from about 300-320° C., and approximately equal to 310° C.

15. The method of claim 4, wherein said first gas comprises at least one of hydrogen, nitrogen, a hydrocarbon and ammonia.

16. The method claim 3, wherein said first gas is preheated to approximately said first process temperature.

17. The method of claim 1, wherein said low-k interlayer dielectric comprises at least one of a porous silicon dioxide, a carbon-doped silicon dioxide, a porous carbon-doped silicon dioxide, a polyimide, a polynorbornene, a benzozyclobutene, a polytetraflouroethylene, a carbon-doped silicon nitride, a porous carbon-doped silicon nitride, a fluorine-doped silicon dioxide, a porous fluorine-doped silicon dioxide, silsesquioxane and methylsilsesquioxane.

18. The method of claim 1, wherein said degas process is performed in a first chamber of a semiconductor processing tool and said preclean process is performed in a second chamber of said semiconductor processing tool.

19. A method, comprising:
providing a semiconductor structure, said semiconductor structure comprising a substrate having a frontside and a backside, an electrically conductive feature comprising copper provided at said frontside of said substrate and a low-k interlayer dielectric provided over said electrically conductive feature;
etching a portion of said interlayer dielectric, a surface of said electrically conductive feature being exposed in the etch process; and
performing a degas process, wherein said semiconductor structure is exposed to a gas comprising at least one hydrocarbon in combination with at least one of hydrogen, nitrogen, and ammonia during said degas process.

20. The method of claim 19, wherein said gas is preheated to approximately a process temperature of said degas process.

21. The method of claim 20, wherein said semiconductor structure is heated from an initial temperature to approximately said process temperature of said degas process during a first phase of said degas process, and wherein said semiconductor structure is maintained at approximately said process temperature of said degas process during a second phase of said degas process, a duration of said first phase of said degas process being shorter than about one-half of a total duration of said degas process.

22. A method, comprising:
providing a semiconductor structure, said semiconductor structure comprising a substrate having a frontside and a backside, an electrically conductive feature comprising copper provided at said frontside of said substrate and an ultra-low-k interlayer dielectric having a dielectric constant of 3 or less provided over said electrically conductive feature;
etching a portion of said interlayer dielectric, a surface of said electrically conductive feature being exposed in the etch process;
performing a degas process, wherein said semiconductor structure is exposed to argon, and wherein said semiconductor structure is heated from at least one of said backside and said frontside of said substrate, wherein said semiconductor structure is heated from an initial temperature to approximately a first process temperature during a first phase of said degas process, and wherein said semiconductor structure is maintained at approximately said first process temperature during a second phase of said degas process, a duration of said first phase of said degas process being shorter than about one-half of a total duration of said degas process, said first process temperature being in a range from about 290-310° C., said total duration of said degas process being in a range from about 50-70 seconds; and after performing said degas process, performing a preclean process to remove etch residuals from said frontside of said substrate, wherein performing said preclean process comprises performing a first preclean phase by exposing said semiconductor structure to hydrogen gas that is in substantially non-ionized form and thereafter performing a second preclean phase using a remote hydrogen plasma, a duration of said second preclean phase being in a range from about one-quarter of a total duration of said preclean process to about one-half of said total duration of said preclean process, said total duration of said preclean process being in a range from about 30-50 seconds, wherein said semiconductor structure is heated to a second process temperature in a range from about 300-320° C. during said preclean process.

23. The method of claim 1, wherein said first gas is substantially pure argon.

24. The method of claim 1, wherein said first gas comprises one or more hydrocarbons.

25. The method of claim 1, wherein said degas and preclean processes are performed in a same process chamber of a semiconductor processing tool.

26. The method of claim 1, wherein said semiconductor structure is heated from said backside during said preclean process.

27. The method of claim 19, further comprising, after performing said degas process, performing a preclean process by exposing said semiconductor structure to hydrogen gas that is in substantially non-ionized form.

28. The method of claim 19, wherein said at least one hydrocarbon comprises at least one of methane, ethane, ethylene, propane, propylene, butane, and butadiene.

* * * * *